(12) United States Patent
Findikoglu et al.

(10) Patent No.: US 7,288,332 B2
(45) Date of Patent: Oct. 30, 2007

(54) CONDUCTIVE LAYER FOR BIAXIALLY ORIENTED SEMICONDUCTOR FILM GROWTH

(75) Inventors: Alp T. Findikoglu, Los Alamos, NM (US); Vladimir Matias, Santa Fe, NM (US)

(73) Assignee: Los Almos National Security, LLC, Los Almos, NM (US)

( * ) Notice: Subject to any disclaimer, the term of this patent is extended or adjusted under 35 U.S.C. 154(b) by 0 days.

(21) Appl. No.: 11/245,721

(22) Filed: Oct. 6, 2005

(65) Prior Publication Data

US 2006/0033160 A1 Feb. 16, 2006

(51) Int. Cl.
*B32B 19/00* (2006.01)
(52) U.S. Cl. ............. 428/698; 428/701; 428/702; 428/469; 428/472; 428/446; 428/450
(58) Field of Classification Search ............. None
See application file for complete search history.

(56) References Cited

U.S. PATENT DOCUMENTS

| | | | |
|---|---|---|---|
| 5,650,378 | A | 7/1997 | Iijima et al. |
| 5,872,080 | A | 2/1999 | Arendt et al. |
| 6,965,128 | B2 | 11/2005 | Holm et al. |
| 2005/0016867 | A1 | 1/2005 | Kreiskott et al. |
| 2006/0115964 | A1* | 6/2006 | Findikoglu et al. ......... 438/509 |

OTHER PUBLICATIONS

Huhne, et al., "Thin biaxially textured TiN flims on amorphous substrates prepared by ion-beam assisted pulsed laser deposition," Appl. Phys. Lett., 85(14), Oct. 4, 2004.*
Huhne et al., "Thin Biaxially Textured TiN Films on Amorphous Substrates Prepared by Ion-Beam Assisted Pulsed Laser Deposition," Appl. Phys. Lett., vol. 85, No. 14, pp. 2744-2746, Oct. 4, 2004.
Findikoglu et al, "Near Single-Crystalline, High-Carrier-Mobility Silicon Thin Film on a Polycrystalline/Amorphous Substrate," U.S. Appl. No. 11/001,461, filed Nov. 30, 2004.

* cited by examiner

*Primary Examiner*—Jennifer C. McNeil
*Assistant Examiner*—Timothy M. Speer
(74) *Attorney, Agent, or Firm*—Robert P. Santandrea; Holly L. Teeter

(57) ABSTRACT

A conductive layer for biaxially oriented semiconductor film growth and a thin film semiconductor structure such as, for example, a photodetector, a photovoltaic cell, or a light emitting diode (LED) that includes a crystallographically oriented semiconducting film disposed on the conductive layer. The thin film semiconductor structure includes: a substrate; a first electrode deposited on the substrate; and a semiconducting layer epitaxially deposited on the first electrode. The first electrode includes a template layer deposited on the substrate and a buffer layer epitaxially deposited on the template layer. The template layer includes a first metal nitride that is electrically conductive and has a rock salt crystal structure, and the buffer layer includes a second metal nitride that is electrically conductive. The semiconducting layer is epitaxially deposited on the buffer layer. A method of making such a thin film semiconductor structure is also described.

24 Claims, 3 Drawing Sheets

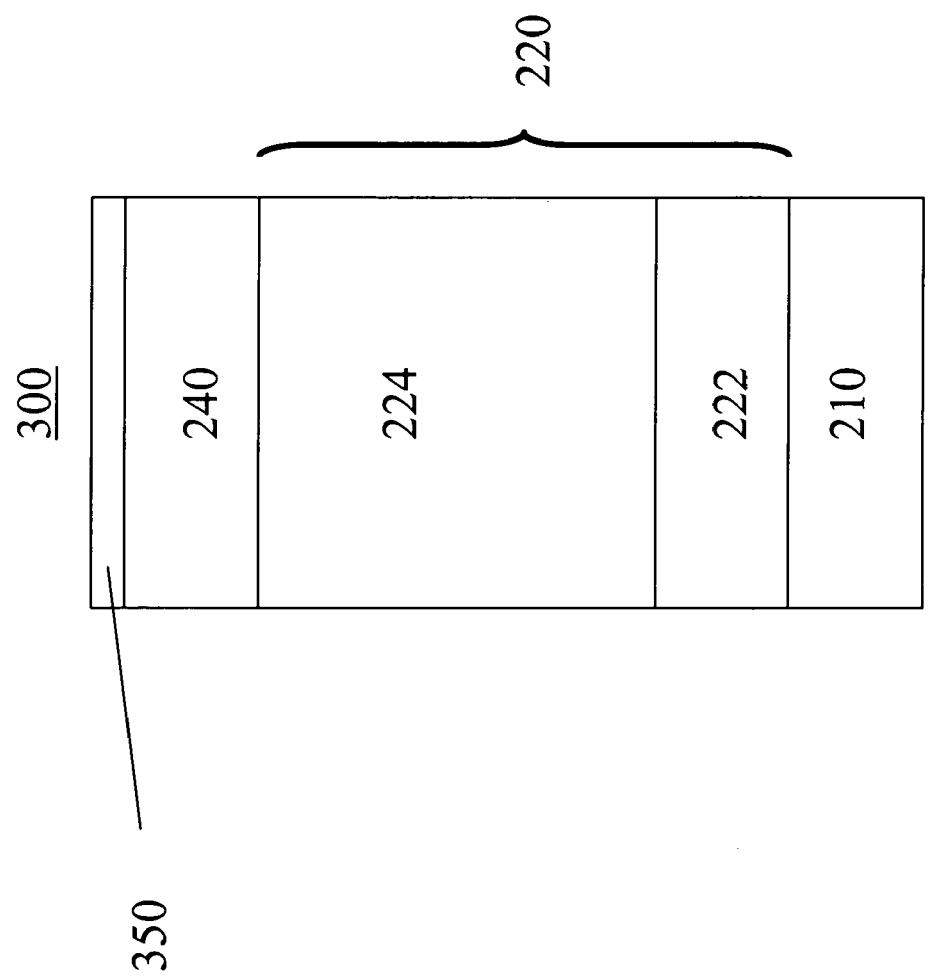

CONDUCTIVE LAYER FOR BIAXIALLY ORIENTED SEMICONDUCTOR FILM GROWTH

STATEMENT REGARDING FEDERAL RIGHTS

This invention was made with government support under Contract No. W-7405-ENG-36, awarded by the U.S. Department of Energy. The government has certain rights in the invention.

BACKGROUND OF INVENTION

The invention relates to a thin film semiconducting structure. More particularly, the invention relates to thin film semiconducting structures such as, for example, photovoltaic cells, photodetectors, and light emitting diodes. Even more particularly, the invention relates to electrodes for such thin film semiconducting electronic structures.

In many thin film semiconductor sensor and device applications, major technical difficulties arise from the lack of a suitable epitaxial template for the growth of well-oriented films. For example, photovoltaic energy conversion efficiency for solar cells based on amorphous silicon architectures seldom surpass 8% efficiency, whereas solar cells that use single-crystalline silicon can approach 24%. Conventional epitaxial film-growth techniques that are used to obtain well-oriented thin films require single-crystal templates that are usually expensive or available on a limited basis.

Biaxially oriented silicon films have been grown on flexible metal tapes by using multiple layers of insulating oxides as diffusion barriers and epitaxial templates. However, in many electronic and sensor applications, such as conventional photovoltaic cells, a conducting layer or electrode is needed under the photosensitive silicon layer to establish an electrical back-contact.

No technology exists for achieving the growth of well-oriented, biaxially oriented non-oxide semiconductors, such as silicon, on either amorphous or polycrystalline templates, with a conductive, biaxially-oriented back electrode. Therefore, what is needed is a thin film semiconducting structure having an oriented semiconductor layer and a conductive, biaxially oriented back-electrode. What is also needed is such a biaxially oriented back-electrode for such structures. Finally, what is needed is a method of making thin film semiconducting structures having such an electrode.

SUMMARY OF INVENTION

The present invention meets these and other needs by providing a conductive layer for biaxially oriented semiconductor film growth and a thin film semiconductor structure such as, for example, a photodetector, a photovoltaic cell, or a light emitting diode (LED) that includes a crystallographically oriented semiconducting film disposed on the conductive layer. A method of making such a thin film semiconductor structure is also described.

Accordingly, one aspect of the invention is to provide a thin film semiconductor structure. The thin film semiconductor structure comprises: a substrate; a first electrode deposited on the substrate; and a semiconducting layer epitaxially deposited on the first electrode. The first electrode comprises a template layer deposited on the substrate and a buffer layer epitaxially deposited on the template layer. The template layer comprises a first metal nitride that is electrically conductive and has a rock salt crystal structure. The buffer layer comprises a second metal nitride that is electrically conductive. The semiconducting layer is epitaxially deposited on the buffer layer.

A second aspect of the invention is to provide an electrode for a semiconductor. The electrode comprises: a template layer comprising a first metal nitride that is electrically conductive and has a rock salt crystal structure; and a buffer layer epitaxially deposited on the template layer. The buffer layer comprises a second metal nitride that is electrically conductive. The template layer is deposited on a substrate by ion beam assisted deposition.

A third aspect of the invention is to provide a thin film semiconductor structure. The thin film semiconductor structure comprises: a substrate; a first electrode deposited on the substrate; a semiconducting layer epitaxially deposited on the first electrode; and a transparent second electrode deposited on the semiconducting layer. The first electrode comprises a template layer deposited by ion beam assisted deposition on the substrate and a buffer layer epitaxially deposited on the template layer. The template layer comprises a first metal nitride that is electrically conductive and has a rock salt crystal structure. The buffer layer comprises a second metal nitride that is electrically conductive. The semiconducting layer is epitaxially deposited on the buffer layer.

A fourth aspect of the invention is to provide a method of making a thin film semiconductor structure. The thin film semiconductor structure comprises a substrate, an electrode comprising a template layer disposed on the substrate, a buffer layer disposed on the template layer, and a semiconducting layer deposited on the buffer layer. The method comprises the steps of: providing the substrate; depositing the template layer on the substrate by ion beam assisted vapor deposition, the template layer comprising a first metal nitride, wherein the first metal nitride is electrically conductive and has a rock salt crystal structure; epitaxially depositing the buffer layer on the template layer, the buffer layer comprising a second metal nitride, wherein the second metal nitride is electrically conductive; and epitaxially depositing the semiconducting layer on the buffer layer to form the thin film semiconductor structure.

These and other aspects, advantages, and salient features of the present invention will become apparent from the following detailed description, the accompanying drawings, and the appended claims.

BRIEF DESCRIPTION OF THE DRAWINGS

FIG. 3 is a schematic cross-sectional view of a second embodiment of a thin film semiconductor structure.

DETAILED DESCRIPTION

Figure 1:
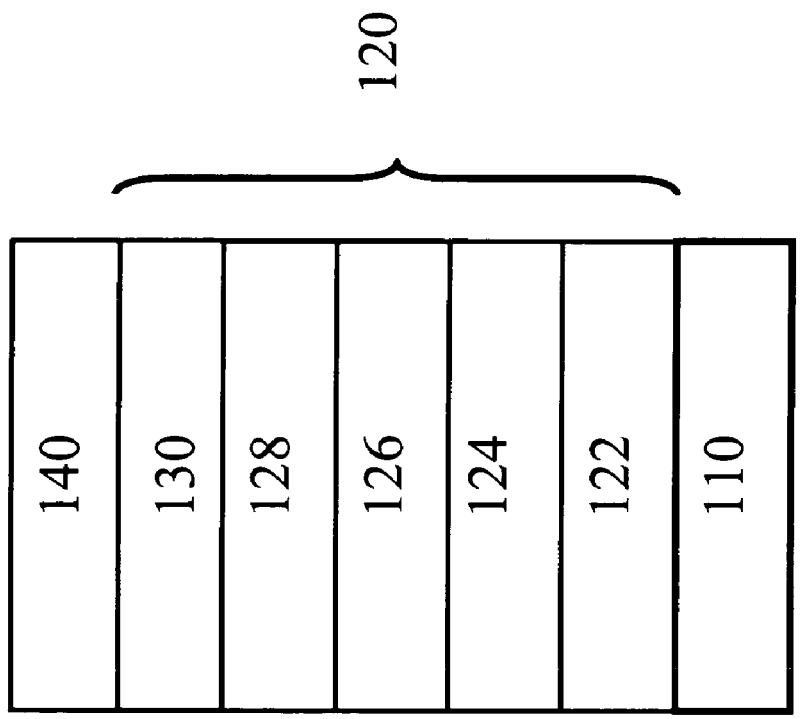
FIG. 1 is a schematic cross-sectional view of a prior art structure having a biaxially oriented silicon film deposited on a polycrystalline template.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing a particular embodiment of the invention and are not intended to limit the invention thereto. A prior-art thin film semiconducting structure comprising a biaxially oriented silicon film deposited on a polycrystalline template is shown in FIG. 1. Structure 100 includes a flexible metal tape 110, a plurality of insulating oxide layers 120 serving as diffusion barriers and epitaxial templates, and a biaxially oriented silicon film 140. In the embodiment shown in FIG. 1, the plurality of insulating buffer layers 120 comprises a diffusion barrier 122 deposited on a metal tape 110, a nucleation layer 124 deposited on diffusion barrier 122, an insulating layer 126 deposited by ion beam assisted deposition (also referred to hereinafter as "IBAD"), a homoepitaxial insulating layer 128 deposited on insulating layer 124, and a template layer 130 deposited on homoepitaxial layer 128. A biaxially oriented semiconducting silicon film 140 is deposited on template layer 130. Compositions, thicknesses, and methods of making the various layers are described in U.S. patent application Ser. No. 11/001,461, entitled "Near Single-Crystalline, High-Carrier-Mobility Silicon Thin Film On A Polycrystalline/Amorphous Substrate," by Alp T. Findikoglu, filed on Nov. 30, 2004, the contents of which are incorporated by reference herein in their entirety.

In many electronic and sensor applications, such as conventional solar cells, photovoltaic cells, photodetectors, and light emitting diodes, a conducting layer underneath the semiconducting silicon film is desirable to provide an electrical contact—also referred to as a "back contact"—to draw current from the device. As seen in FIG. 1, structure 100 does not include such a contact. Instead, semiconducting silicon film 140 is disposed on a series of insulating oxide layers 120.

Figure 2:
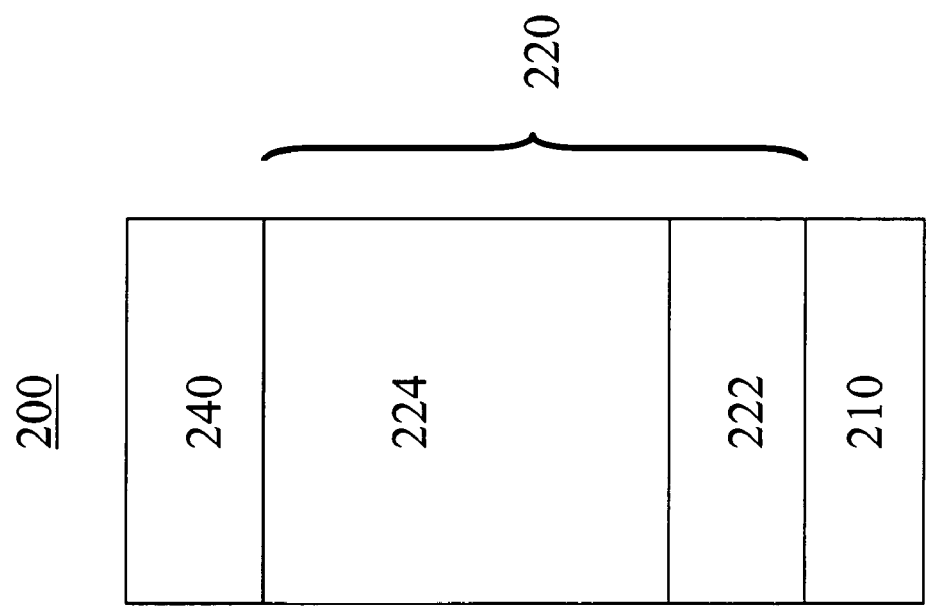
FIG. 2 is a schematic cross-sectional view of a thin film semiconductor structure of the present invention.

A thin film semiconductor structure of the present invention is shown in FIG. 2. As used herein, a thin film semiconductor structure, in one embodiment, refers to a structure that comprises a semiconducting material that is either responsive to electromagnetic radiation such as, for example, light in any of the visible, ultraviolet, and infrared spectra. When photons impinge upon such a semiconducting material, free electrons and, consequently, an electronic signal, are generated. Such thin film semiconductor structures include, but are not limited to, solar cells, photovoltaic cells, and the like. Alternatively, a thin film semiconductor structure comprises semiconducting material that emits electromagnetic radiation. One example of such a thin film semiconducting material is a light emitting diode (LED). Turning to FIG. 2, thin film semiconductor structure 200 includes a substrate 210 and a first electrode 220 deposited on substrate 220. First electrode 220 comprises a template layer 222 deposited on substrate 210 and a buffer layer 224 epitaxially deposited on template layer 222. Buffer layer 224 is electrically conductive. A biaxially oriented semiconducting layer 240 is epitaxially deposited on buffer layer 224.

As used herein, an "epitaxial" or "epitaxially deposited" layer is a layer in which the biaxial orientation or crystallographic texture of the underlying "host" material (e.g., a template or buffer layer) onto which the layer is grown defines a corresponding biaxial orientation or crystallographic texture in the layer. The underlying material and the epitaxially deposited layer need not have the same crystal structure. As used herein, the terms "biaxially oriented" and "biaxial orientation" refer to a surface or layer in which the crystal grains are in close alignment both in the plane and out of the plane (i.e., perpendicular to the plane) of the surface of the layer. One type of biaxially oriented surface is a cubic textured surface in which the crystal grains are in close alignment with directions both parallel and perpendicular to the surface.

Substrate 210 must be substantially inert at the temperatures at which subsequently deposited layers, including template layer 222, buffer layer 224, and semiconducting layer 240 are deposited. Substrate is typically not a single crystal substrate, but instead is either a polycrystalline or amorphous material. In one embodiment, substrate 210 is a metallic substrate, such as, for example a metal tape. The metal tape comprises at least one of: a nickel-base alloy such as, but not limited to, Hastelloy, Inconel alloys, and Haynes alloys; an iron-based alloy, and combinations thereof. In one non-limiting example, the metal tape comprises Hastelloy C-276. Prior to depositing template layer 222 on substrate 210, the metallic tape may be mechanically polished, electrochemically polished, chemically/mechanically polished, or etched to achieve a desired degree of smoothness. For example, the metal tape substrate may be cleaned by $Ar^+$ ion etching or by $Ar^+/N^+$ reactive ion etching. Electrochemical polishing methods that may be used to achieve the desired degree of smoothness of the metal tape are described in U.S. patent application Ser. No. 10/624,350, entitled "High Current Density Electropolishing in the Preparation of Highly Smooth Substrate Tapes for Coated Conductors," by Sascha Kreiskott et al., filed on Jul. 21, 2003, the contents of which are incorporated by reference herein in their entirety.

In another embodiment, substrate 210 is a glass substrate. In yet another embodiment, substrate 210 is a graphitic substrate.

IBAD has been widely used in the preparation of high temperature superconducting films in coated conductors. IBAD texturing can produce nearly single-crystalline films with crystallographic properties approaching those of conventional epitaxial thin films by using an off-normal ion beam to establish a preferred orientation for film growth on a non-single-crystalline (i.e., amorphous or polycrystalline) substrate. Once established, this IBAD layer serves as a biaxially-oriented template for the epitaxial growth of subsequent layers. The principles of IBAD are described in U.S. Pat. No. 5,650,378 by Yauhiro Iijima et al., entitled "Method of making Polycrystalline Thin Film and Superconducting Body," and issued on Jul. 22, 1997, and U.S. Pat. No. 5,872,080 by Paul N. Arendt et al., entitled "High Temperature Superconducting Thick Films, issued Feb. 16, 1999. The contents of U.S. Pat. Nos. 5,650,378 and 5,872,080 are incorporated herein by reference in their entirety.

Template layer 222 establishes a crystallographic template upon which successive layers of material having the same or similar crystallographic orientation or texture may be deposited. Template layer 222 has a biaxially oriented texture. Template layer 222 comprises a first metal nitride that is electrically conductive and has a rock salt crystal structure. The first metal nitride is selected from the group consisting of titanium nitride, nickel nitride, tantalum nitride, aluminum nitride, chromium nitride, silicon nitride, gallium nitride, carbon nitride, and combinations thereof. Template layer 222 has a thickness in a range from about 0.01 micrometer to about 1 micrometer. In one embodiment, the first metal nitride is deposited on substrate 210 by IBAD. In one non-limiting example, a titanium nitride (TiN) layer having biaxial texture and a thickness of about 0.01 micrometer may be deposited at room temperature using reactive ion beam assisted deposition (RIBAD). During deposition by RIBAD, the nitride is formed by providing the metal constituent of the metal nitride to substrate 210 by either physical vapor deposition or chemical vapor deposition, while directing a beam comprising $Ar^+$ and $N^+$ ions at substrate 210 at a predetermined angle (usually about 45°) from an axis normal to substrate 210.

Buffer layer 224 is epitaxially deposited on template layer 222 and is biaxially oriented with respect to template layer 222. Buffer layer 224 extends the crystalline order established by template layer 222 to achieve a desired thickness of first electrode 220 and to decrease the sheet resistance of first electrode 220. In addition, buffer layer 224 provides a diffusion barrier between substrate 210 and semiconducting layer 240. Buffer layer 224 comprises a second metal nitride that is electrically conductive. The second metal nitride is selected from a group consisting of titanium nitride, nickel nitride, tantalum nitride, aluminum nitride, chromium nitride, silicon nitride, gallium nitride, carbon nitride, and combinations thereof.

The thickness of buffer layer 222 depends on the specific application of thin film semiconductor structure 200. In one embodiment, buffer layer 224 has a thickness in a range from about 0.1 micrometer to about 10 micrometers. Buffer layer 224 may be formed by various deposition methods known in the art, such as sputtering, electron beam evaporation, metal-organic deposition, metal-organic chemical vapor deposition, chemical vapor deposition, polymer assisted deposition, laser ablation, and the like. For example, a homoepitaxial TiN layer having a thickness in a range from about 0.1 micrometer to about 10 micrometers may be deposited by reactive sputtering onto a TiN template layer such as that described above.

The first metal nitride and second metal nitride may comprise the same material, in which case buffer layer 224 is homoepitaxially deposited on template layer 222. For example, in one embodiment, both the first metal nitride and second metal nitride comprise titanium nitride (TiN). Alternatively, the first metal nitride and second metal nitride comprise different materials; i.e., the first metal nitride may be a nitride that is different from the second metal nitride.

Both template layer 222 and buffer layer 224 are thermally stable in vacuum up to a temperature in a range from about 500° C. to about 800° C. For the purposes of describing the invention, "thermally stable" means that template layer 222 and buffer layer 224 do not diffuse into, decompose or react with each other, substrate 210, or semiconducting layer 240 to any substantial degree.

Biaxially oriented semiconducting layer 240 is epitaxially grown upon buffer layer 224. In one embodiment, semiconducting layer 240 comprises at least one of silicon, germanium, cadmium telluride (CdTe), cadmium sulfide (CdS), copper indium selenide ($CuInSe_2$), copper indium sulfide ($CuInS_2$), copper indium gallium selenide ($CuGaInSe_2$), gallium arsenide (GaAs), carbon nitride, and combinations thereof. In one particular embodiment, semiconducting layer is biaxially oriented silicon. As previously described, the biaxially oriented semiconducting layer 240 includes a plurality of crystal grains that are in close crystallographic alignment both in the plane and out of the plane (i.e., perpendicular to the plane) of the surface of semiconducting layer 240. Additionally, the crystal grains within semiconducting layer 240 are in close crystallographic alignment with the crystal grains within buffer layer 224.

Biaxially oriented semiconducting layer 240 may include multiple layers or have dopant profiles to establish junctions within the layer and to achieve a desired purpose. Examples of such junctions include p-n junctions, p-I-n junctions, and Schottky barrier junctions. The structures of such junctions and methods of making them are well known in the art.

Biaxially oriented semiconducting layer 240 may be deposited, for example, by: pulsed laser deposition; evaporative methods such co-evaporation, e-beam evaporation, activated reactive evaporation and the like; sputtering techniques, including magnetron sputtering, ion beam sputtering, ion assisted sputtering, and the like; cathodic arc deposition; chemical vapor deposition methods, including organometallic chemical vapor deposition, plasma enhanced chemical vapor deposition, and the like; molecular beam epitaxy; sol-gel processes; and liquid phase epitaxy. In one embodiment, semiconducting layer 240 may first be deposited as either an amorphous, a nanocrystalline phase, or a polycrystalline phase at low temperature (i.e.; less than 500° C. by one of the above mentioned techniques, and then crystallized to obtain a biaxial texture. The crystallization may be carried out using either a fast process, such as pulsed laser annealing, or a slow process, such as solid phase crystallization. Deposition of semiconducting layer 240 is generally conducted under low vacuum conditions so as to minimize formation of oxides.

In one non-limiting example, a heteroepitaxial layer of silicon having a thickness in a range from about 0.03 micrometer to about 10 micrometers may be grown on buffer layer 224. Where semiconducting layer 240 is silicon, the out-of-plane and in-plane orientation distribution of the biaxially oriented film are at most 2° and 6°, respectively. Crystalline coordination is cube-on-cube, starting with template layer 222 and continuing through buffer layer 224 and semiconducting layer 240. Where template layer 222 is IBAD-deposited TiN, template layer 222 grows with a (00l) crystallographic orientation normal to substrate 210. Buffer layer 224 also has the (00l) crystallographic orientation normal to substrate 210. Finally, the heteroepitaxially grown silicon layer grows with the (00l) orientation normal to the substrate.

In one embodiment, shown in FIG. 3, thin film semiconductor structure 300 further includes a transparent second electrode 350 disposed on semiconducting layer 240. In one embodiment, transparent second electrode 350 comprises one of a semiconducting oxide and a semiconducting nitride. The semiconducting oxide is an oxide of a metal selected from the group consisting of zinc, tin, indium, cadmium, copper, silver, gold, and combinations thereof. In a particular embodiment, the semiconducting oxide is one of zinc oxide, indium zinc oxide, and indium tin oxide. The semiconducting nitride is a nitride selected from the group consisting of gallium nitride, silicon nitride, and carbon nitride. Transparent second electrode 350 facilitates the use of thin film semiconductor structure 300 as either a photovoltaic cell, LED, or a photodetector.

The following example illustrates the advantages and features of the present invention, and is intended not to limit the invention thereto.

EXAMPLE 1

Using the following sequence of materials and deposition parameters, biaxially-oriented silicon films were deposited on TiN films that were homoepitaxially grown on IBAD TiN layers. The IBAD TiN layer was deposited on non-crystalline templates of electrochemically-polished metal tape (Hastelloy C-276). First, the non-crystalline template surface (Hastelloy C-276) was reactively ion etched and cleaned for about 30 seconds using $Ar^+$ and $N^+$ ions and a 22×6-cm radio-frequency Kaufman source (40 mA, 750 V Ar⁺ and N⁺ beam with Ar to N$_2$ gas flow ratio of 10:6). Room-temperature Reactive-Ion-beam-assisted deposition (RIBAD) was then used to deposit a 10-nm-thick TiN layer on the metal tape to achieve bi-axial texture. Ar⁺ and N⁺ beams were directed at the substrate at an angle of 45° to substrate normal (40 mA/750 V with Ar to N$_2$ gas flows of 10 and 6 sccm, respectively) during Ti deposition. Titanium was deposited at a rate of about 0.3 nm/s, with ion-etched/deposited TiN film thickness ratio of about 19%. A 200-400 nm thick TiN film was then homoepitaxially deposited using reactive sputtering. The growth rate of TiN was 0.1 nm/s at about 550° C. in about 3 mTorr of an Ar-N$_2$ mixture with Ar:N$_2$ ratio of 6. The reactively sputtered TiN improved crystallinity, surface coverage, and diffusion barrier characteristics of the entire TiN layer. A 0.1-to-2-µm thick layer of silicon was hetero-epitaxial grown at a rate of 0.5 nm/s at about 780° C., with a background pressure of less than 5×10⁻⁶. The crystallinity of the silicon films on TiN buffers was determined by x-ray diffraction. In-plane and out-of-plane mosaic spreads were about 4 and 2 degrees, respectively, indicating good biaxial texture.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A thin film semiconducting structure, the thin film semiconductor structure comprising:
   a) a substrate;
   b) a first electrode deposited on the substrate, the first electrode comprising:
      i) a template layer deposited on the substrate, the template layer comprising a first metal nitride, wherein the first metal nitride is electrically conductive and has a rock salt crystal structure; and
      ii) a buffer layer epitaxially deposited on the template layer, the buffer layer comprising a second metal nitride, wherein the second metal nitride is electrically conductive; and
   c) a semiconducting layer epitaxially deposited on the first electrode.

2. The thin film semiconductor structure according to claim 1, further comprising a transparent second electrode deposited on a surface of the semiconducting layer.

3. The thin film semiconductor structure according to claim 2, wherein the transparent second electrode comprises one of a semiconducting oxide and a semiconducting nitride.

4. The thin film semiconductor structure according to claim 3, wherein the semiconducting oxide is an oxide of at least one metal selected from the group consisting of zinc, tin, gallium, indium, cadmium, copper, silver, gold, and combinations thereof.

5. The thin film semiconductor structure according to claim 4, wherein the semiconducting oxide is one of zinc oxide, indium zinc oxide, and indium tin oxide.

6. The thin film semiconductor structure according to claim 3, wherein the semiconducting nitride is a nitride selected from the group consisting of gallium nitride, silicon nitride, carbon nitride, and combinations thereof.

7. The thin film semiconductor structure according to claim 2, wherein the thin film semiconductor structure is one of a photovoltaic cell, a photodetector, and a light emitting diode.

8. The thin film semiconductor structure according to claim 1, wherein the substrate is one of a metallic substrate, a graphitic substrate, and a glass substrate.

9. The thin film semiconductor structure according to claim 5, wherein the metallic substrate comprises at least one of a nickel-based alloy, an iron-based alloy, and combinations thereof.

10. The thin film semiconductor structure according to claim 1, wherein the template layer has a thickness in a range from about 0.01 micrometer to about 1 micrometer.

11. The thin film semiconductor structure according to claim 1, wherein each of the first metal nitride and the second metal nitride independently is a metal nitride selected from the group consisting of titanium nitride, nickel nitride, tantalum nitride, aluminum nitride, chromium nitride, silicon nitride, gallium nitride, carbon nitride, and combinations thereof.

12. The thin film semiconductor structure according to claim 1, wherein the first metal nitride is deposited on the substrate by ion beam assisted deposition.

13. The thin film semiconductor structure according to claim 1, wherein the first nitride and the second nitride comprise the same material.

14. The thin film semiconductor structure according to claim 1, wherein the buffer layer is deposited by one of sputtering, electron beam evaporation, metal-organic deposition, metal-organic chemical vapor deposition, chemical vapor deposition, polymer assisted deposition, and laser ablation.

15. The thin film semiconductor structure according to claim 1, wherein the buffer layer has a thickness in a range from about 0.1 micrometer to about 10 micrometers.

16. The thin film semiconductor structure according to claim 1, wherein the template layer and the buffer layer are thermally stable up to a temperature in a range from about 500° C. and about 800° C.

17. The thin film semiconductor structure according to claim 1, wherein the semiconducting layer comprises at least one of silicon, germanium, cadmium telluride, cadmium sulfide, copper indium selenide, copper indium sulfide, copper indium gallium selenide, gallium arsenide, carbon nitride, and combinations thereof.

18. The thin film semiconductor structure according to claim 1, wherein the semiconductor layer is deposited on the buffer layer by one of pulsed laser deposition, evaporation, sputtering, cathodic arc deposition, chemical vapor deposition, molecular beam epitaxy, sol-gel processes, and liquid phase epitaxy.

19. The thin film semiconductor structure according to claim 1, wherein the semiconductor layer is deposited on the buffer layer by:
   a. depositing the semiconducting layer in one of an amorphous phase, a nanocrystalline phase, and a polycrystalline phase; and
   b. crystallizing the semiconducting layer to obtain a biaxial texture.

20. An electrode for a thin film semiconductor structure, the electrode comprising:
   a) a substrate having a modified surface;
   b) a template layer disposed upon the modified surface comprising a first metal nitride, wherein the first metal nitride is electrically conductive and has a rock salt crystal structure, and wherein the template layer is deposited on the modified surface by ion beam assisted deposition; and c) a buffer layer epitaxially deposited on the template layer, the buffer layer comprising a second metal nitride, wherein the second metal nitride is electrically conductive.

21. The electrode according to claim 20, wherein each of the first metal nitride and the second metal nitride independently is a metal nitride selected from the group consisting of titanium nitride, nickel nitride, tantalum nitride, aluminum nitride, chromium nitride, gallium nitride, and combinations thereof.

22. The electrode according to claim 20, wherein the first nitride and the second nitride comprise the same material.

23. The electrode according to claim 20, wherein the template layer and the buffer layer are thermally stable up to a temperature in a range from about 500° C. and about 800° C.

24. A thin film semiconductor structure, the thin film semiconductor structure comprising:
a) a substrate;
b) a first electrode deposited on the substrate, the first electrode comprising:
  i) a template layer deposited on the substrate, the template layer comprising a first metal nitride, wherein the first metal nitride is electrically conductive and has a rock salt crystal structure, wherein the template layer is deposited by ion beam assisted deposition; and
  ii) a buffer layer epitaxially deposited on the template layer on the substrate, the buffer layer comprising a second metal nitride, wherein the second metal nitride is electrically conductive;
c) a semiconducting layer epitaxially deposited on the first electrode; and
d) a transparent second electrode deposited on the semiconducting layer.

* * * * *